United States Patent
Jang et al.

(10) Patent No.: US 7,782,101 B2
(45) Date of Patent: Aug. 24, 2010

(54) INJECTION-LOCKED FREQUENCY DIVIDER

(75) Inventors: Sheng-Lyang Jang, Taipei (TW); Cheng-Chen Liu, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 152 days.

(21) Appl. No.: 12/164,117

(22) Filed: Jun. 30, 2008

(65) Prior Publication Data

US 2009/0251177 A1  Oct. 8, 2009

(30) Foreign Application Priority Data

Apr. 3, 2008 (TW) .............................. 97112275 A

(51) Int. Cl.
*H03B 19/06* (2006.01)
(52) U.S. Cl. ..................... 327/118; 327/115; 327/117; 331/117 R; 331/117 FE; 331/167; 331/177 V; 331/181
(58) Field of Classification Search ............ 331/117 R, 331/117 FE, 167, 177 V, 181; 327/115, 117, 327/118
See application file for complete search history.

(56) References Cited

U.S. PATENT DOCUMENTS

| 2007/0257735 A1 | 11/2007 | Chan et al. | |
| 2008/0278250 A1* | 11/2008 | Hung et al. | 331/117 R |
| 2009/0189704 A1* | 7/2009 | Li | 331/117 R |

FOREIGN PATENT DOCUMENTS

| JP | 55096737 | 7/1980 |
| TW | I283966 | 7/2007 |

OTHER PUBLICATIONS

Author: Sheng-Lyang Jang, and Chien-Feng Lee Title: A Wide Locking Range LC-Tank Injection-Locked Frequency Divider Date: Aug. 2007 Publisher: IEEE Volume: IEEE Microwave and Wireless Components Letters, vol. 17, No. 8.*
Author: Sheng-Lyang Jang, Chien-Feng Lee, and Wei-Hsung Yeh Title: A Divide-by-3 Injection Locked Frequency Divider With Single-Ended Input Date: Feb. 2008 Publisher: IEEE Volume: IEEE Microwave and Wireless Components Letters, vol. 18, No. 2.*
Author: Sheng-Lyang Jang, and Shao-Hwa Lee Title: A Wide Band Injection Locked Frequency Divider With Variable Inductor Load Date: Jun. 2007 Publisher: IEEE Volume: IEEE Microwave and Wireless Components Letters, vol. 17, No. 6.*

* cited by examiner

*Primary Examiner*—Arnold Kinkead
*Assistant Examiner*—Richard Tan
(74) *Attorney, Agent, or Firm*—Jianq Chyun IP Office

(57) ABSTRACT

An injection-locked frequency divider for dividing a frequency of an injection signal and obtaining a frequency divided signal is provided. The injection-locked frequency divider includes a signal injection unit and an oscillator. The signal injection unit includes a first input terminal and a second input terminal for receiving the injection signal. The received injection signal exhibits a phase difference of 180° between the first input terminal and the second input terminal. The oscillator includes an inductor unit and a variable capacitance unit. The injection-locked frequency divider is featured with a wide injection locking range, and can be realized with a low operation voltage, and therefore can be conveniently used in different kinds of hybrid ICs.

25 Claims, 6 Drawing Sheets

INJECTION-LOCKED FREQUENCY DIVIDER

CROSS-REFERENCE TO RELATED APPLICATION

This application claims the priority benefit of Taiwan application serial no. 97112275, filed on Apr. 3, 2008. The entirety of the above-mentioned patent application is hereby incorporated by reference herein and made a part of specification.

BACKGROUND OF THE INVENTION

1. Field of the Invention

The present invention generally relates to an injection-locked frequency divider, and more particularly, to a differential injection-locked frequency divider.

2. Description of Related Art

Frequency dividers are widely used in hybrid integrated circuits (IC). For example, frequency dividers are critical components for multiplexers, phase-locked loops (PLL), and frequency synthesizers. Currently, responsive to the demands of consumers, and the variations of system technologies, injection-locked frequency dividers, which are more suitable for operations of high speed systems, have become outstanding among variety of frequency dividers. Typically, a present injection-locked frequency divider usually input signals from only a single terminal.

FIG. 1 is a circuit diagram illustrating a conventional injection-locked frequency divider. Referencing to FIG. 1, a conventional injection-locked frequency divider 100 includes an oscillator 110 that is a Colpitts oscillator and a signal injection unit 120. The signal injection unit 120 receives an injection signal SIN1 by a single terminal. The oscillator 110 adjusts an oscillation frequency thereof via a reactance control signal SIP1. When an oscillation frequency of the oscillator 110 approaches to one third of frequency of the injection signal SIN1, the conventional injection-locked frequency divider 100 locks and generates a dividing signal SDI1. Such an injection-locked frequency divider 100 having such an injection type is called a direct injection divider. The signal injection unit 120 includes transistors M01, and M02. Source/drain terminals of the transistors M01 and M02 are equipotential, and therefore consume two sets of source/drain currents. As such, such kinds of circuits usually consume a lot of power when being operated at a high frequency, and will configure ring oscillation frequency dividers when applied in ordinary digital circuits so that the frequency thereof would be restricted.

Therefore, in practical operation, a conventional injection-locked frequency divider typically has the disadvantages of smaller locking range and large power consumption. In other words, such a restricted conventional injection-locked frequency divider can not be widely applied in so many kinds of hybrid ICs.

SUMMARY OF THE INVENTION

Accordingly, the present invention is directed to an injection-locked frequency divider, adapted for improving an injection locking range and achieving a low operation voltage by a phase difference of 180° between two input terminals for receiving an injection signal.

The present invention provides an injection-locked frequency divider, for dividing a frequency of an injection signal, and obtaining a frequency divided signal. The injection-locked frequency divider includes a signal injection unit and an oscillator. The signal injection unit includes a first input terminal and a second input terminal for receiving the injection signal. The received injection signal exhibits a phase difference of 180° between the first input terminal and the second input terminal. The oscillator includes an inductor unit and a variable capacitance unit. The inductor unit includes a first connection terminal, a second connection terminal, a third connection terminal, and a fourth connection terminal. The first connection terminal, the second connection terminal, the third connection terminal, and the fourth connection terminal of the inductor unit are coupled to the signal injection unit. The variable capacitance unit has a first terminal coupled to the first connection terminal, and a second terminal coupled to the fourth connection terminal.

According to an embodiment of the present invention, the signal injection unit includes a first transistor, and a second transistor. The first transistor includes a first terminal coupled to the second connection terminal, a second terminal coupled to the first connection terminal, and a gate terminal coupled to the first input terminal. The second transistor includes a first terminal coupled to the third connection terminal, a second terminal coupled to the fourth connection terminal, and a gate terminal coupled to the second input terminal.

According to an embodiment of the present invention, the injection-locked frequency divider further includes a first buffer circuit coupled to the oscillator for outputting a frequency divided signal.

According to an embodiment of the present invention, the injection-locked frequency divider further includes a second buffer circuit coupled to the fourth connection terminal, in which the first buffer circuit is coupled to the first connection terminal, and a frequency divided signal outputted from the first buffer circuit and a frequency divided signal outputted from the second buffer terminal have a relative phase difference of 180°.

According to an embodiment of the present invention, the variable capacitance unit includes a first variable capacitor and a second variable capacitor. A first terminal of the first variable capacitor is coupled to the first connection terminal. A first terminal of the second variable capacitor is coupled to the fourth connection terminal. A second terminal of the second variable capacitor is coupled to the second terminal of the first variable capacitor.

According to an embodiment of the present invention, while a reactance control signal is applied to the second terminal of the first variable capacitor, the first variable capacitor can be used to control the injection locking range of the oscillator.

According to an embodiment of the present invention, the oscillator includes a negative impedance unit. The negative impedance unit includes a third transistor and a fourth transistor. A first terminal of the third transistor is coupled to the first connection terminal. A gate terminal of the third transistor is coupled to the fourth connection terminal. A first terminal of the fourth transistor is coupled to the fourth connection terminal. A gate terminal of the fourth transistor is coupled to the first connection terminal. A second terminal of the fourth transistor is coupled to a second terminal of the third transistor.

According to an embodiment of the present invention, the third transistor and the fourth transistor are N-type transistors or P-type transistors.

According to an embodiment of the present invention, the negative impedance unit includes a fifth transistor and a sixth transistor. A first terminal of the fifth transistor is coupled to the first connection terminal. A gate terminal of the fifth transistor is coupled to the fourth connection terminal. A first terminal of the sixth transistor is coupled to the fourth connection terminal. A gate terminal of the sixth transistor is coupled to the first connection terminal. A second terminal of the sixth terminal is coupled to a second terminal of the fifth terminal. The fifth transistor and the sixth transistor are P-type transistors. The third transistor and the fourth transistor are N-type transistors.

According to an embodiment of the present invention, the oscillator is a Colpitts oscillator, a Hartley oscillator, or an Armstrong oscillator.

According to an embodiment of the present invention, the frequency of the injection signal is three times that of the frequency divided signal.

The present invention is also directed to an injection-locked frequency divider for dividing a frequency of an injection signal and obtaining a four-phase frequency divided signal. The injection-locked frequency divider includes a signal injection unit, a first oscillator, and a second oscillator. The signal injection unit includes a first input terminal, a second input terminal, a third input terminal, and a fourth input terminal for receiving the injection signal. The received injection signal exhibits a phase difference of 0° between the first input terminal and the third input terminal, a phase difference of 180° between the first input terminal and the second input terminal, and a phase difference of 180° between the first input terminal and the fourth input terminal. The first oscillator includes a first inductor unit, and a first variable capacitance unit. The second oscillator includes a second inductor unit, and a second variable capacitance unit. The first inductor unit includes a first connection terminal, a second connection terminal, a third connection terminal, and a fourth connection terminal. The first connection terminal, the second connection terminal, the third connection terminal, and the fourth connection terminal of the first inductor unit are coupled to the signal injection unit. The first variable capacitance unit includes a first terminal coupled to the first connection terminal, and a second terminal coupled to the fourth connection terminal. The second inductor unit includes a fifth connection terminal, a sixth connection terminal, a seventh connection terminal, and an eighth connection terminal. The fifth connection terminal, the sixth connection terminal, the seventh connection terminal, and the eighth connection terminal of the second inductor unit are coupled to the signal injection unit. The second variable capacitance unit includes a first terminal coupled to the fifth connection terminal, and a second terminal coupled to the eighth connection terminal.

According to an embodiment of the present invention, the signal injection unit includes a first transistor, a second transistor, a third transistor, and a fourth transistor. A first terminal of the first transistor is coupled to the second connection terminal. A second terminal of the first transistor is coupled to the first connection terminal. A gate terminal of the first transistor is coupled to the first input terminal. A first terminal of the second transistor is coupled to the third connection terminal. A second terminal of the second transistor is coupled to the fourth connection terminal. A gate terminal of the second transistor is coupled to the second input terminal. A first terminal of the third transistor is coupled to the sixth connection terminal. A second terminal of the third transistor is coupled to the fifth connection terminal. A gate terminal of the third transistor is coupled to the third input terminal. A first terminal of the fourth transistor is coupled to the seventh connection terminal. A second terminal of the fourth transistor is coupled to the eighth connection terminal. A gate terminal of the fourth transistor is coupled to the fourth input terminal.

According to an embodiment of the present invention, the first variable capacitance unit includes a first variable capacitor and a second variable capacitor. The second variable capacitance unit includes a third variable capacitor and a fourth variable capacitor. A first terminal of the first variable capacitor is coupled to the first connection terminal. A first terminal of the second variable capacitor is coupled to the fourth connection terminal. A second terminal of the second variable capacitor is coupled to a second terminal of the first variable capacitor. A first terminal of the third variable capacitor is coupled to the fifth connection terminal. A first terminal of the fourth variable capacitor is coupled to the eighth connection terminal. A second terminal of the third variable capacitor is coupled to a second terminal of the fourth variable capacitor.

According to an embodiment of the present invention, the first oscillator includes a first negative impedance unit, and the second oscillator includes a second negative impedance unit. The first negative impedance unit includes a fifth N-type transistor, a sixth N-type transistor, a seventh P-type transistor, an eighth P-type transistor, and a ninth P-type transistor, and a tenth P-type transistor. The second negative impedance unit includes an eleventh N-type transistor, a twelfth N-type transistor, a thirteenth P-type transistor, a fourteenth P-type transistor, and a fifteenth P-type transistor, and a sixteenth P-type transistor. A first terminal of the fifth N-type transistor is coupled to the first connection terminal. A gate terminal of the fifth N-type transistor is coupled to the fourth connection terminal. A first terminal of the sixth N-type transistor is coupled to the fourth connection terminal. A gate terminal of the sixth N-type transistor is coupled to the first connection terminal. A second terminal of the sixth N-type transistor is coupled to a second terminal of the fifth N-type transistor. A first terminal of the seventh P-type transistor is coupled to the first connection terminal. A gate terminal of the seventh P-type transistor is coupled to the fourth connection terminal. A first terminal of the eighth P-type transistor is coupled to the fourth connection terminal. A gate terminal of the eighth P-type transistor is coupled to the first connection terminal. A second terminal of the eighth P-type transistor is coupled to a second terminal of the seventh P-type transistor. A first terminal of the ninth P-type transistor is coupled to the first connection terminal. A gate terminal of the ninth P-type transistor is coupled to the eighth connection terminal. A second terminal of the ninth P-type transistor is coupled to the second terminal of the seventh P-type transistor. A first terminal of the tenth P-type transistor is coupled to the fourth connection terminal. A gate terminal of the tenth P-type transistor is coupled to the fifth connection terminal. A second terminal of the tenth P-type transistor is coupled to a second terminal of the eighth P-type transistor. A first terminal of the eleventh N-type transistor is coupled to the fifth connection terminal. A gate terminal of the eleventh N-type transistor is coupled to the eighth connection terminal. A first terminal of the twelfth N-type transistor is coupled to the eighth connection terminal. A gate terminal of the twelfth N-type transistor is coupled to the fifth connection terminal. A second terminal of the twelfth N-type transistor is coupled to a second terminal of the eleventh N-type transistor. A first terminal of the thirteenth P-type transistor is coupled to the fifth connection terminal. A gate terminal of the thirteenth P-type transistor is coupled to the eighth connection terminal. A second terminal of the thirteenth P-type transistor is coupled to the second terminal of the eighth P-type transistor. A first terminal of the fourteenth P-type transistor is coupled to the eighth connection terminal. A gate terminal of the fourteenth P-type transistor is coupled to the fifth connection terminal. A second terminal of the fourteenth P-type transistor is coupled to a second terminal of the thirteenth P-type transistor. A first terminal of the fifteenth P-type transistor is coupled to the fifth connection terminal. A gate terminal of the fifteenth P-type transistor is coupled to the first connection terminal. A second terminal of the fifteenth P-type transistor is coupled to the second terminal of the thirteenth P-type transistor. A first terminal of the sixteenth P-type transistor is coupled to the eighth connection terminal. A gate terminal of the sixteenth P-type transistor is coupled to the fourth connection terminal. A second terminal of the sixteenth P-type transistor is coupled to a second terminal of the fourteenth P-type transistor.

According to an embodiment of the present invention, the injection-locked frequency divider further includes a first buffer circuit, a second buffer circuit, a third buffer circuit, and a fourth buffer circuit. The first buffer circuit is coupled to the first connection terminal. The second buffer circuit is coupled to the fourth connection terminal. The third buffer circuit is coupled to the fifth connection terminal. The fourth buffer circuit is coupled to the eighth connection terminal. When a frequency divided signal outputted from the first buffer circuit has a phase of 0°, the second buffer circuit, the third buffer circuit, and the fourth buffer circuit exhibit relative phase differences of 180°, 90°, and 270° respectively relative to the first buffer circuit.

According to an embodiment of the present invention, the second terminal of the first variable capacitor and the second terminal of the third variable capacitor receive a reactance control signal, and the first oscillator and the second oscillator adjust the injection locking range according to the reactance control signal.

According to an embodiment of the present invention, the first oscillator and the second oscillator are Colpitts oscillators, Hartley oscillators, or Armstrong oscillators.

According to an embodiment of the present invention, a frequency of the injection signal of the four-phase injection-locked frequency divider is three times that of the frequency divided signal.

In general, the injection-locked frequency divider according to the present invention receives a differential injection signal with two input terminals. There is a phase difference of 180° between these two input terminals. Such an injection-locked frequency divider according to the present invention is featured with a wide injection locking range, and can be realized with a low operation voltage, and therefore can be conveniently used in different kinds of hybrid ICs.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
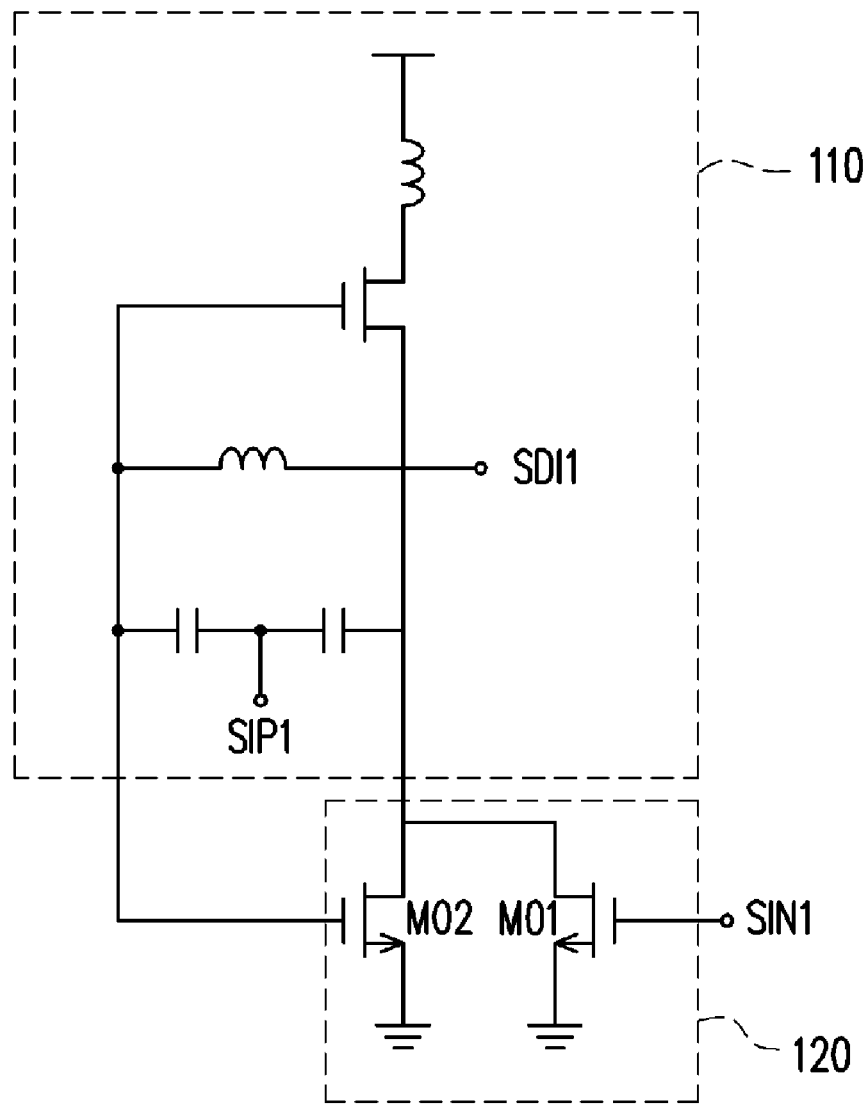
FIG. 1 is a circuit diagram illustrating a conventional injection-locked frequency divider that includes a Colpitts oscillator.

Reference will now be made in detail to the present preferred embodiments of the invention, examples of which are illustrated in the accompanying drawings. Wherever possible, the same reference numbers are used in the drawings and the description to refer to the same or like parts. Further, when a member is described as being connected to or coupled to another member, it may be connected to or coupled to the another member, either directly or indirectly. On the contrary, when a member is defined as being directly connected to or coupled to another member, it excludes any third party member coupled therebetween.

Figure 2:
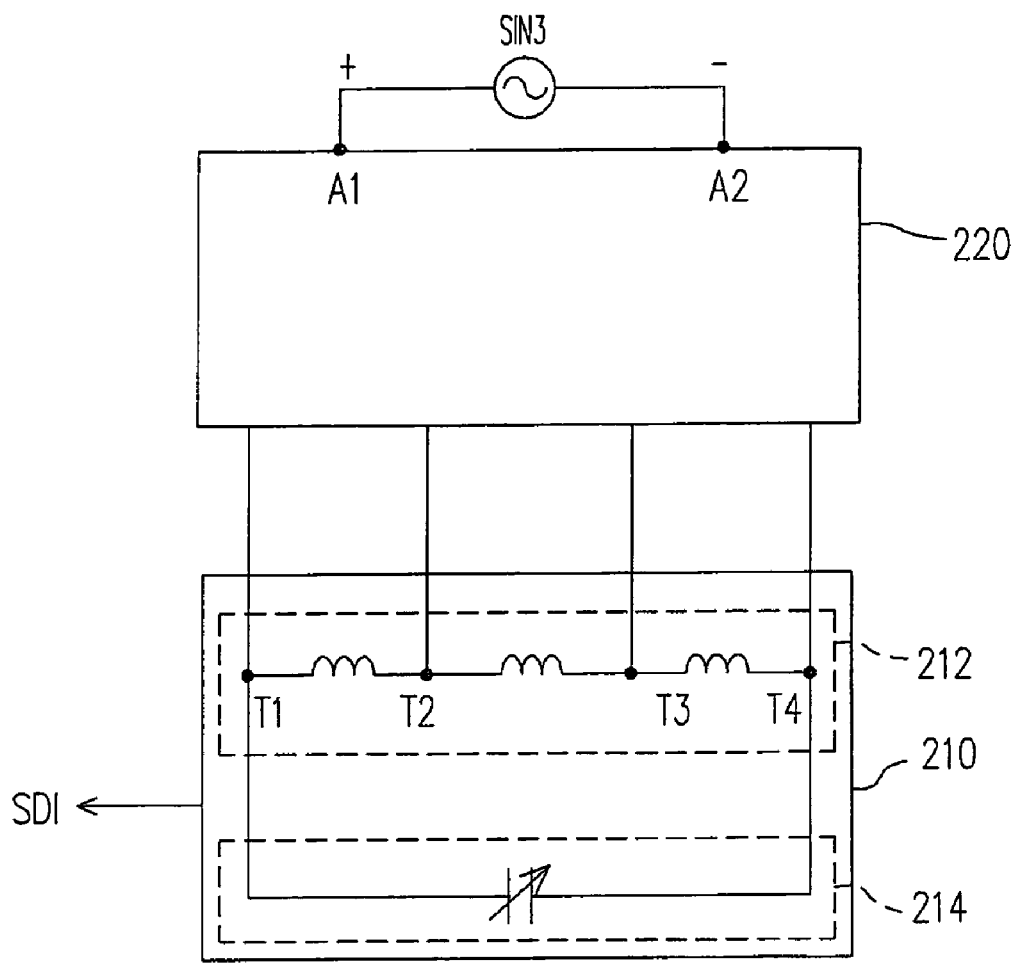
FIG. 2 is a circuit diagram illustrating an injection-locked frequency divider according to an embodiment of the present invention.

FIG. 2 is a circuit diagram illustrating an injection-locked frequency divider according to an embodiment of the present invention. Referring to FIG. 2, an injection-locked frequency divider 200 adapted for dividing a frequency of an injection signal SIN3, and obtaining a frequency divided signal SDI is shown. The injection-locked frequency divider 200 includes a signal injection unit 220, and an oscillator 210. The signal injection unit 220 includes a first input terminal A1, and a second input terminal A2 for receiving the injection signal SIN3. The received injection signal SIN3 exhibits a phase difference of 180° between the first input terminal A1 and the second input terminal A2. The oscillator 210 includes an inductor unit 212, and a variable capacitance unit 214, which compose an inductor-capacitor resonant circuit. The inductor unit 212 includes a first connection terminal T1, a second connection terminal T2, a third connection terminal T3, and a fourth connection terminal T4. The first connection terminal T1, the second connection terminal T2, the third connection terminal T3, and the fourth connection terminal T4 are coupled to the signal injection unit 220. The variable capacitance unit 214 includes a first terminal coupled to the first connection terminal T1, a second terminal coupled to the fourth connection terminal T4.

It is supposed that a natural oscillation frequency of the oscillator 210 is $f_{free}$, and the frequency of the injection signal SIN3 is f0. When the natural oscillation frequency $f_{free}$ and the frequency f0 of the injection signal SIN3 differ too much, the injection-locked frequency divider 200 is incapable of locking the injection signal SIN3. A ratio of the frequency locking range of the injection-locked frequency divider 200 can be obtained by calculating an equation of $[(f_{OH}-f_{OL})/(2\times f_{free})]$, in which $f_{OH}$ represents a maximum input frequency which can be locked, and $f_{OL}$ represents a minimum input frequency which can be locked. When designing an injection-locked frequency divider, a higher ratio of the frequency locking range is often desired.

The signal injection unit 220 provides a medium for transmitting the injection signal SIN3 to the oscillator 210. The circuit can be varied in many forms for achieving such a signal injection unit. Such a frequency divider receiving a differential injection signal having a phase difference of 180°, e.g., the received injection signal SIN3 has a phase of 0° at the first input terminal A1, and has a phase of 180° at the second input terminal A2, is adapted for dividing a frequency by 3, and obtains a frequency divided signal SDI having a frequency that is one third of the frequency of the injection signal SIN3. In other words, for example, the injection signal SIN3 is within the injection locking range, and has a frequency of 7.2 GHz, the injection-locked frequency divider 200 can correspondingly obtain a frequency divided signal SDI having a frequency of 2.4 GHz. Further, those skilled in the art would be aware of realizing the inductor unit 212 with an independent inductor or transformer.

Further, according to an aspect of the embodiment, the oscillator 210 can be any oscillator employing an inductor-capacitor resonant circuit, such as a Colpitts oscillator, a Hartley oscillator, a cross-couple oscillator, or an Armstrong oscillator.

Figure 3:
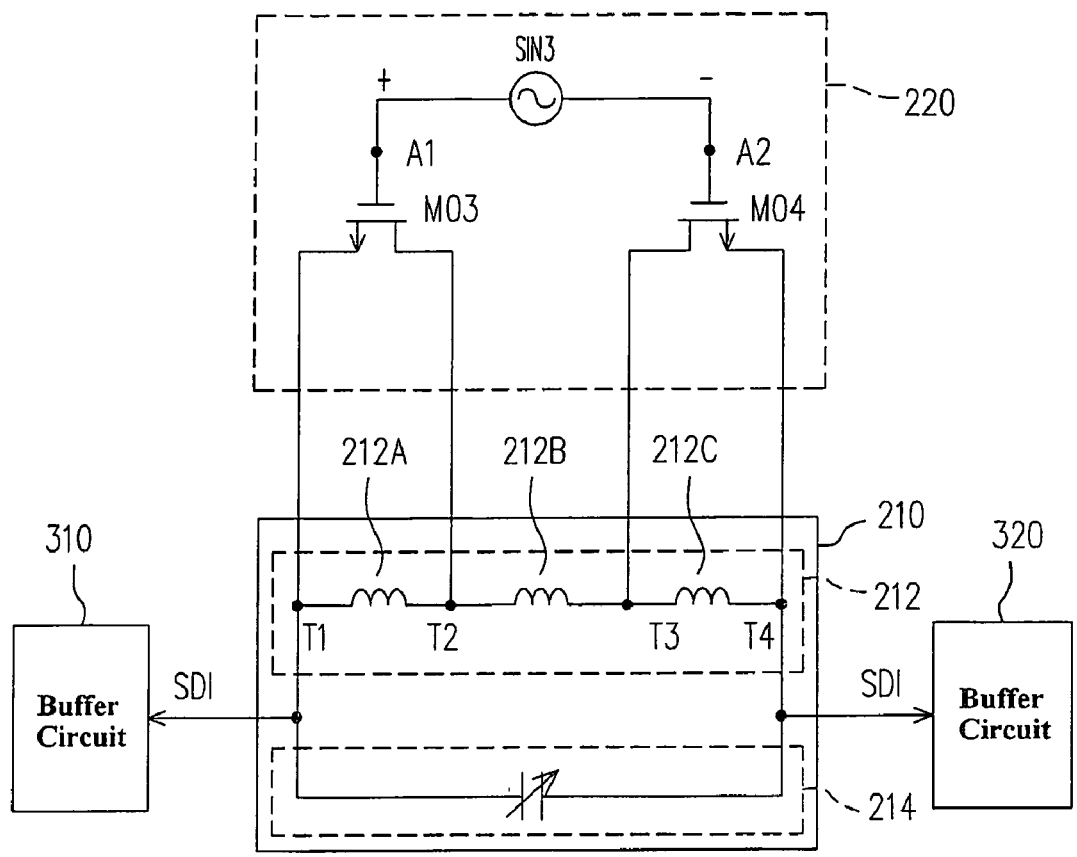
FIG. 3 is a circuit diagram illustrating an injection-locked frequency divider derived from the embodiment of FIG. 2.

FIG. 3 is a circuit diagram illustrating an injection-locked frequency divider derived from the embodiment of FIG. 2. Referring to FIG. 3, an injection-locked frequency divider 300 similar in operation principle of the injection-locked frequency divider 200 of FIG. 2 is shown. In the injection-locked frequency divider 300 of FIG. 3, the signal injection unit 220 further includes transistors M03 and M04. The transistor M03 includes a first terminal coupled to the second connection terminal T2, a second terminal coupled to the first connection terminal T1, and a gate terminal coupled to the first input terminal A1. The transistor M04 includes a first terminal coupled to the third connection terminal T3, a second terminal coupled to the fourth connection terminal T4, and a gate terminal coupled to the second input terminal A2.

The inductor unit 212 of FIG. 3, for example, can be composed of inductors 212A, 212B, and 212C. The transistor M03 is parallel connected with the inductor 212A, and the transistor M04 is parallel connected with the inductor 212C. In accordance with such a differential injection frequency divider, the transistor M03 will affect the inductor 212A, and the transistor M04 will affect the inductor 212C. When switched to conduct, the inductor is indicated as not affected by the injection signal. On the contrary, when switched to non-conduct, the inductor is indicated as being affected by the injection signal. In other words, the injection-locked frequency divider 300 drives the transistor to switch the inductors with a differential injection, so as to achieve the function of dividing frequency by 3.

It should be noted that the transistors M03 and M04 are connected in parallel with the inductors 212A and 212C, respectively, and there is no other transistor inside the signal injection unit 220 coupled to the transistors M03 and M04. As such, when injecting signals, there is no need to use a conventional double layer transistor where the transistor M03 or M04 is located. As such, a source/drain current for a layer of transistor is saved, and thus the overall power consumption is saved.

The signal injection unit is realized with a single layer of transistor, and therefore does not require for stacking another layer of transistor thereon in processing, thus saving the overall layout area and avoiding unnecessary conventional power consumption.

The transistors M03 and M04 are not stacked with other transistors, and therefore they require a low power voltage supply for operation. The injection-locked frequency divider 300 is thus adapted for operation under a low voltage and consuming a low power. The injection-locked frequency divider according to the embodiment of the present invention is adapted for application of 802.11a/b/g communication protocol or a communication protocol of a higher frequency.

Further, the injection-locked frequency divider 300 further includes a buffer circuit 310, which is coupled to the oscillator 210 for outputting the frequency divided signal SDI. The buffer circuit 310 is adapted for measurement. In a typical measurement operation, an ordinary measurement apparatus is 50 ohms. When such a 50 ohms measurement apparatus is directly coupled to an output port rather than coupled to the output port via the buffer circuit 310, the frequency divided signal SDI probably cannot be measured. In this manner, employing the buffer circuit 300 can advantageously avoid a loading effect of a direct current (DC) probe, and therefore preventing an oscillation frequency deviation of the oscillator 210.

In the injection-locked frequency divider 300, according to an aspect of the embodiment of the present invention, the first connection terminal T1 is taken serving as the output port of the frequency divided signal SDI, or otherwise the first connection terminal T1 and the fourth connection terminal T4 are taken serving as two output ports. The injection-locked frequency divider 300 may further includes a buffer circuit 320 coupled to the fourth connection terminal T4, while the buffer circuit 310 is coupled to the first connection terminal T1. The frequency divided signals SDI outputted from the buffer circuit 310 and the buffer circuit 320 have a phase difference of 180°. Those skilled in the art would understand that the employment of the buffer circuit is for the purpose of avoiding the loading effect. The buffer circuit can be realized with complementary transistors, open drain circuits, or open source circuits.

Figure 4:
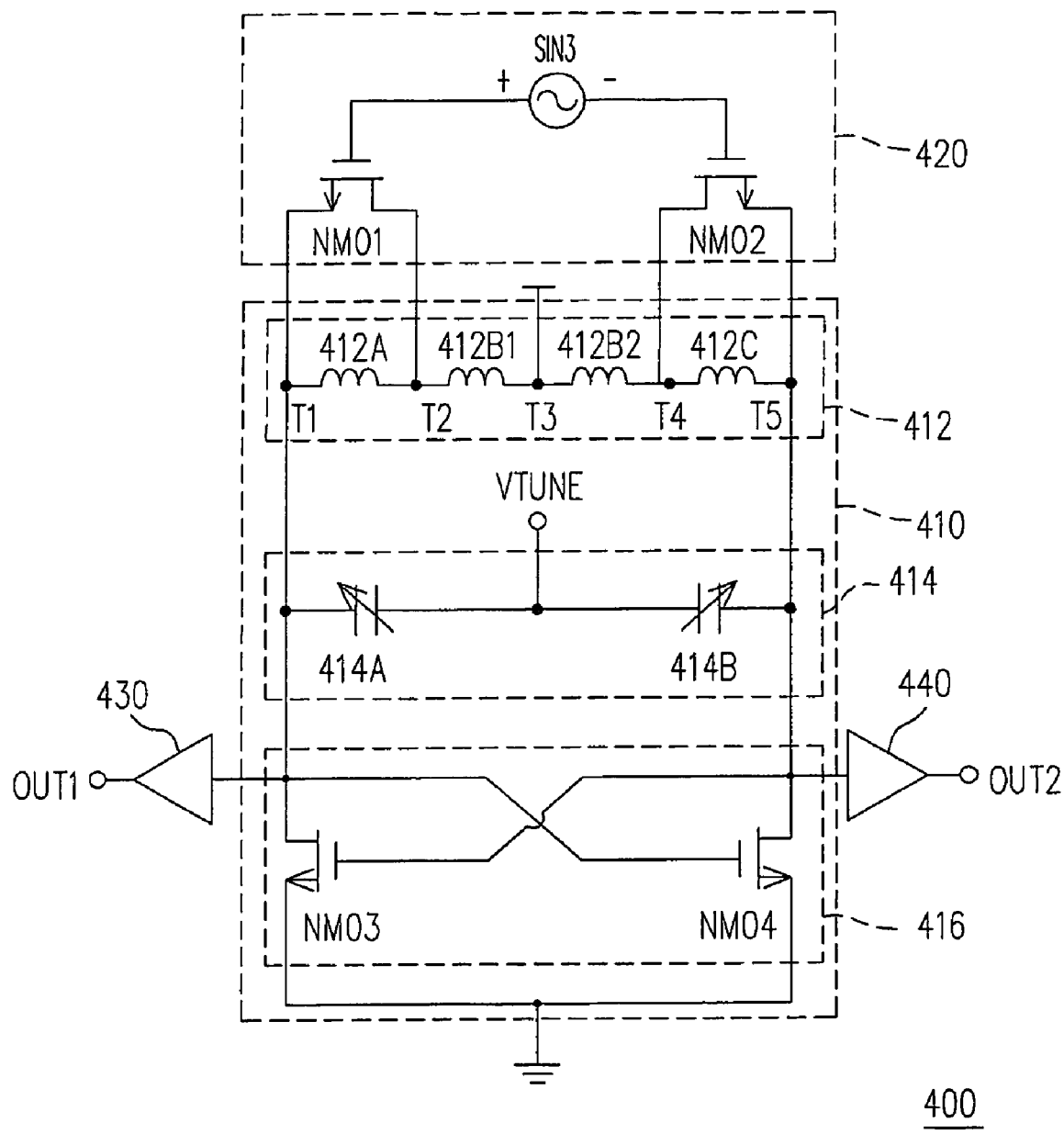
FIG. 4 is a circuit diagram illustrating an injection-locked frequency divider derived from the embodiment of FIG. 2 that includes a cross-coupled differential oscillator.

FIG. 4 is a circuit diagram illustrating another injection-locked frequency divider derived from the embodiment of FIG. 2. As shown in FIG. 4, the injection-locked frequency divider 400 includes a signal injection unit 420, an oscillator 410 and buffer circuits 430 and 440. The signal injection unit 420 includes transistors NM01 and NM02. The oscillator 410 includes an inductor unit 412, a variable capacitance unit 414, and a negative impedance unit 416. The inductor unit 412 can be realized by independent inductor or a transformer. In the current embodiment, the inductor unit 412 is exemplified as being composed of inductors 412A, 412B1, 412B2, and 412C. The transistor NM01 is connected in parallel with the inductor 412A, and the transistor NM02 is connected in parallel with the inductor 412C. The injection-locked frequency divider 400 drives the transistor to switch the inductors 412A and 412C with a differential injection, so as to achieve the function to dividing frequency by 3. Signal output terminals OUT1 and OUT2 are provided for outputting a frequency divided signal. In such a way, the current embodiment can achieve a similar function of the embodiment of FIG. 3.

The variable capacitance unit 414 may further include a variable capacitor 414A and a variable capacitor 414B. A first terminal of the variable capacitor 414A is coupled to the first connection terminal T1. A first terminal of the variable capacitor 414B is coupled to the fourth connection terminal T4, and a second terminal of the variable capacitor 414A is coupled to a second terminal of the variable capacitor 414B. The variable capacitors 414A and 414B are all adapted for adjusting the capacitance values thereof. As such, an oscillation frequency of the oscillator 410 can be varied by changing the voltage applied to over the variable capacitors. Therefore, the second terminal of the variable capacitor 414A is adapted for receiving a reactance control signal VTUNE, and the oscillator 410 is adapted for adjusting the injection locking range according to the reactance control signal VTUNE.

The negative impedance unit 416 further includes transistors NM03 and NM04. A first terminal of the transistor NM03 is coupled to the first connection terminal T1, and a gate terminal of the transistor NM03 is coupled to the fourth connection terminal T4. A first terminal of the transistor NM04 is coupled to the fourth connection terminal T4, and a gate terminal of the transistor NM04 is coupled to the first connection terminal T1. A second terminal of the transistor NM04 is coupled to a second terminal of the transistor NM03. In the current embodiment, the transistors NM03 and NM04 of the negative impedance unit 416 are all N-type transistors and configure a negative resistance by cross-coupling. Those skilled in the art may modify the embodiment of the present invention by using P-type transistor to realize the negative impedance unit 416 in accordance with the spirit and within the scope of the present invention.

Figure 5:
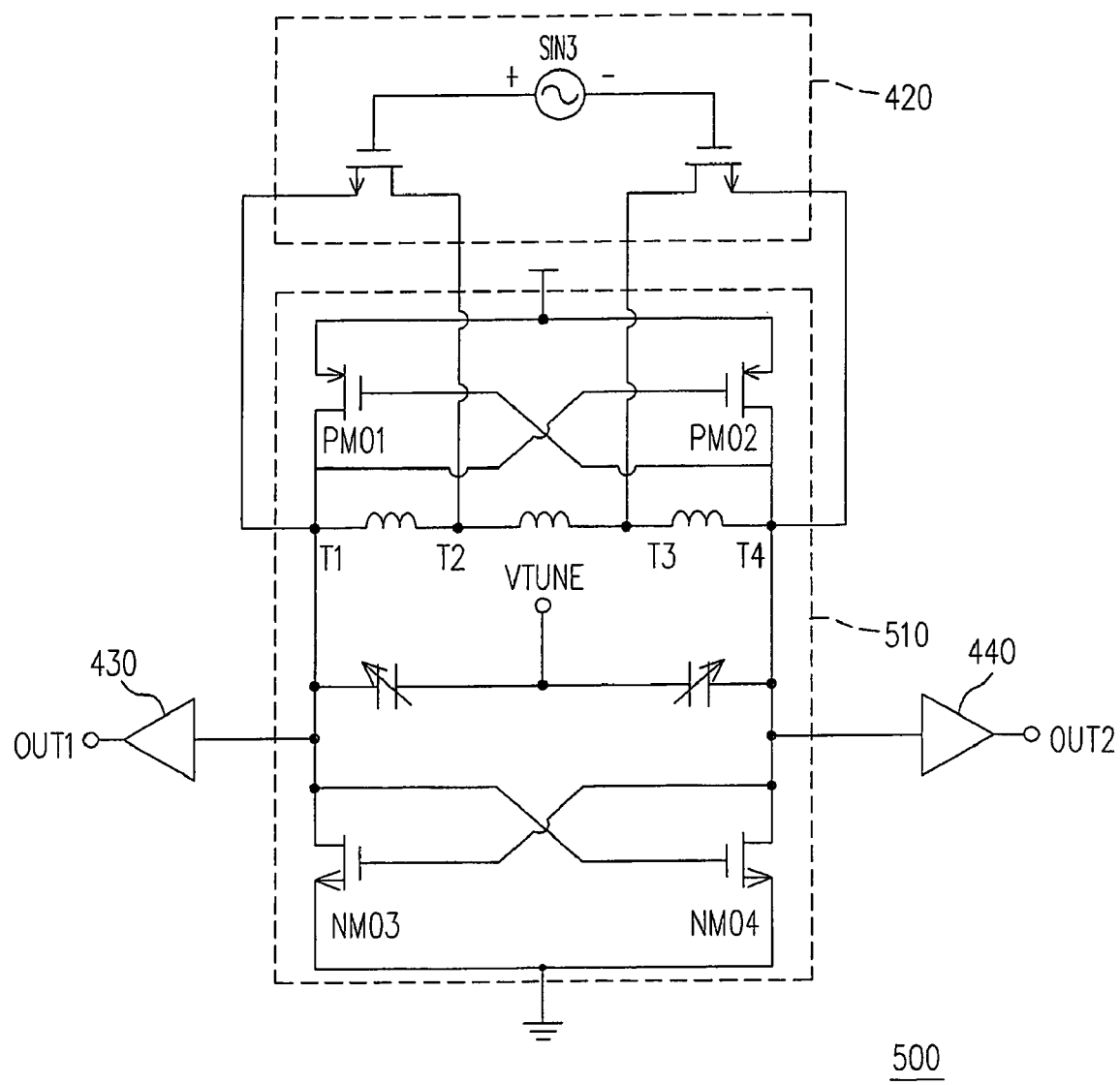
FIG. 5 is a circuit diagram illustrating another injection-locked frequency derived from the embodiment of FIG. 2 that includes a cross-coupled differential oscillator.

FIG. 5 is a circuit diagram illustrating a further injection-locked frequency divider derived from the embodiment of FIG. 2. Referring to FIG. 5, an injection-locked frequency divider 500 including a signal injection unit 420, an oscillator 510, and buffer circuits 430 and 440 is shown. The injection-locked frequency divider 500 has an operation principle similar to that the injection-locked frequency divider 400 as shown in FIG. 4. Corresponding or related parts can be learnt by referring to the discussing or teaching about FIG. 4.

In the oscillator 510, the negative impedance unit includes transistors PM01, PM02, NM03, and NM04. The transistors PM01, PM02 are P-type transistors, and the transistors NM03, NM04 are N-type transistors. In the present embodiment, the negative impedance unit generates a negative resistance by complementary cross-coupling connection. The complementary cross-coupling connection is configured as: a first terminal of the transistor PM01 is coupled to the first connection terminal T1, and a gate terminal of the transistor PM01 is coupled to the fourth connection terminal T4; a first terminal of the transistor PM02 is coupled to the fourth connection terminal T4, a gate terminal of the transistor PM02 is coupled to the first connection terminal T1, and a second terminal of the transistor PM02 is coupled to a second terminal of the transistor PM01; a first terminal of the transistor NM03 is coupled to the first connection terminal T1, and a gate terminal of the transistor NM03 is coupled to the fourth connection terminal T4; and a first terminal of the transistor NM04 is coupled to the fourth connection terminal T4, a gate terminal of the transistor NM04 is coupled to the first connection terminal T1, and a second terminal of the transistor NM04 is coupled to a second terminal of the transistor NM03.

Figure 6:
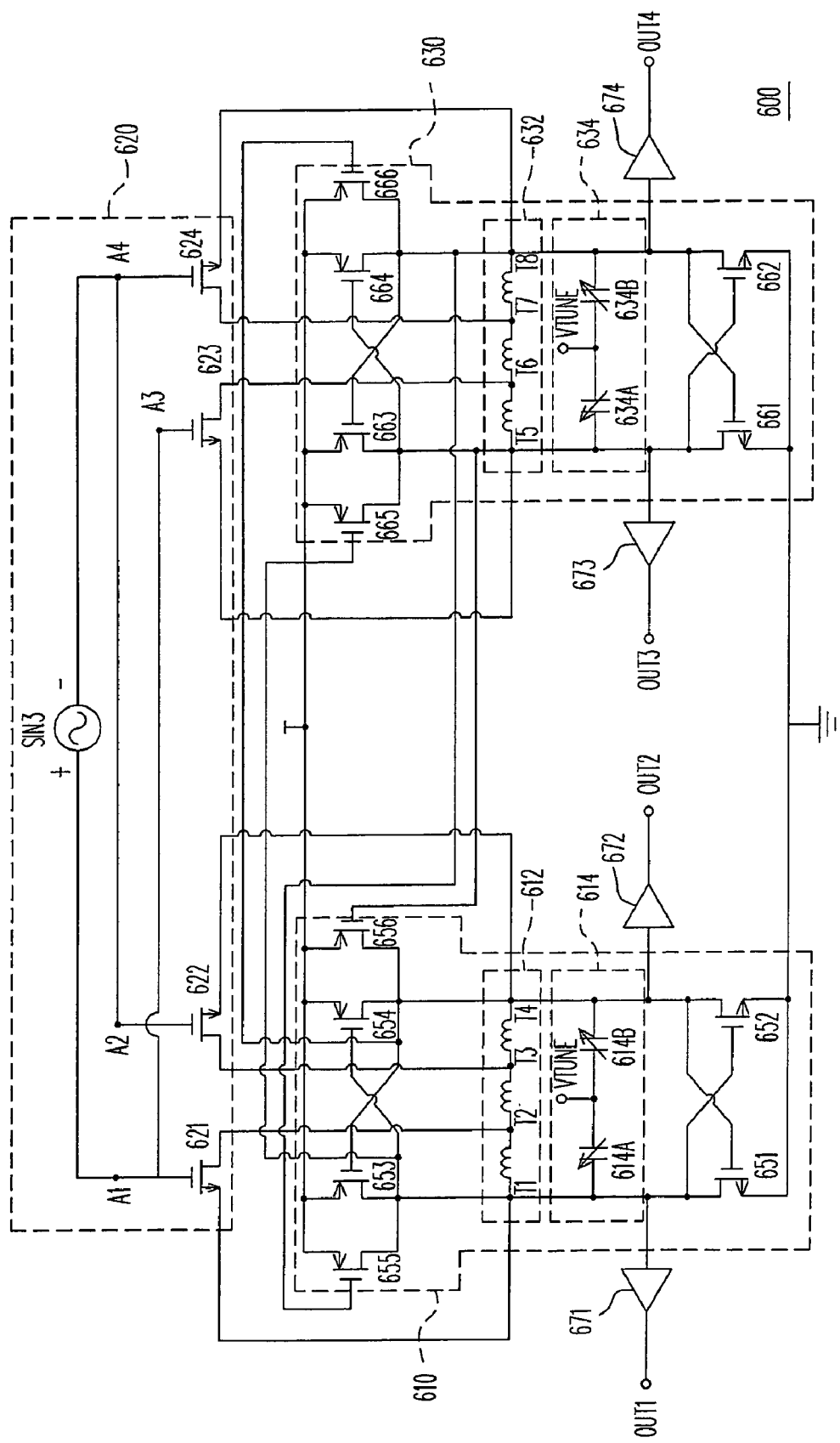
FIG. 6 is a circuit diagram illustrating an injection-locked frequency divider according to another embodiment of the present invention that includes cross-coupled differential oscillators.

FIG. 6 is a circuit diagram illustrating an injection-locked frequency divider according to another embodiment of the present invention. Referring to FIG. 6, an injection-locked frequency divider 600 for dividing a frequency of the injection signal SIN3 is shown. The injection-locked frequency divider 600 has an operation principle similar to the embodiments discussed above. The injection-locked frequency divider 600 includes a signal injection unit 620, a first oscillator 610, and a second oscillator 630. The signal injection unit 620 includes a first input terminal A1, a second input terminal A2, a third input terminal A3, and a fourth input terminal A4, for receiving the injection signal SIN3. The received injection signal SIN3 exhibits a phase difference of 0° between the first input terminal A1 and the third input terminal A3, exhibits a phase difference of 180° between the first input terminal A1 and the second input terminal A2, and exhibits a phase difference of 180° between the first input terminal A1 and the fourth input terminal A4. The first oscillator 610 includes a first inductor unit 612, and a variable capacitance unit 614. The second oscillator 630 includes a second inductor 632, and a second variable capacitance unit 634. The first inductor unit 612 includes a first connection terminal T1, a second connection terminal T2, a third connection terminal T3, and a fourth connection terminal T4. The first connection terminal T1, the second connection terminal T2, the third connection terminal T3, and the fourth connection terminal T4 of the first inductor unit 612 are coupled to the signal injection unit 620. The first variable capacitance unit 614 includes a first terminal coupled to the first connection terminal T1, and a second terminal coupled to the fourth connection terminal T4. The second inductor unit 632 includes a fifth connection terminal T5, a sixth connection terminal T6, a seventh connection terminal T7, and an eighth connection terminal T8. The fifth connection terminal T5, the sixth connection terminal T6, the seventh connection terminal T7, and the eighth connection terminal T8 of the second inductor unit 632 are coupled to the signal injection unit 620. The second variable capacitance unit 634 includes a first terminal coupled to the fifth connection terminal T5, and a second terminal coupled to the eighth connection terminal T8.

The signal injection unit 620 includes transistors 621, 622, 623, and 624. A first terminal of the transistor 621 is coupled to the second connection terminal T2. A second terminal of the transistor 621 is coupled to the first connection terminal T1. A gate terminal of the transistor 621 is coupled to the first input terminal A1. A first terminal of the transistor 622 is coupled to the third connection terminal T3. A second terminal of the transistor 622 is coupled to the fourth connection terminal T4. A gate terminal of the transistor 622 is coupled to the second input terminal A2. A first terminal of the transistor 623 is coupled to the sixth connection terminal T6. A second terminal of the transistor 623 is coupled to the fifth connection terminal T5. A gate terminal of the transistor 623 is coupled to the third input terminal A3. A first terminal of the transistor 624 is coupled to the seventh connection terminal T7. A second terminal of the transistor 624 is coupled to the eighth connection terminal T8. A gate terminal of the transistor 624 is coupled to the fourth input terminal A4.

The first variable capacitance unit 614 includes variable capacitors 614A and 614B. The second variable capacitance unit includes variable capacitors 634A and 634B. A first terminal of the variable capacitor 614A is coupled to the first connection terminal T1. A first terminal of the variable capacitor 614B is coupled to the fourth connection terminal T4. A second terminal of the variable capacitor 614B is coupled to a second terminal of the variable capacitor 614A. A first terminal of the variable capacitor 634A is coupled to the fifth connection terminal T5. A first terminal of the variable capacitor 634B is coupled to the eighth connection terminal T8. A second terminal of the variable capacitor 634A is coupled to a second terminal of the variable capacitor 634B.

The first oscillator 610 includes a first negative impedance unit, and the second oscillator 630 includes a second negative impedance unit. The first negative impedance unit includes N-type transistors 651 and 652, and P-type transistors 653, 654, 655, and 656. The second negative impedance unit includes N-type transistors 661 and 662, and P-type transistors 663, 664, 665, and 666. A first terminal of the N-type transistor 651 is coupled to the first connection terminal T1. A gate terminal of the N-type transistor 651 is coupled to the fourth connection terminal T4. A first terminal of the N-type transistor 652 is coupled to the fourth connection terminal T4. A gate terminal of the N-type transistor 652 is coupled to the first connection terminal T1. A second terminal of the N-type transistor 652 is coupled to a second terminal of the N-type transistor 651. A first terminal of the P-type transistor 653 is coupled to the first connection terminal T1. A gate terminal of the P-type transistor 653 is coupled to the fourth connection terminal T4. A first terminal of the P-type transistor 654 is coupled to the fourth connection terminal T4. A gate terminal of the P-type transistor 654 is coupled to the first connection terminal T1. A second terminal of the P-type transistor 654 is coupled to a second terminal of the P-type transistor 653. A first terminal of the P-type transistor 655 is coupled to the first connection terminal T1. A gate terminal of the P-type transistor 655 is coupled to the eighth connection terminal T8. A second terminal of the P-type transistor 655 is coupled to the second terminal of the P-type transistor 653. A first terminal of the P-type transistor 656 is coupled to the fourth connection terminal T4. A gate terminal of the P-type transistor 656 is coupled to the fifth connection terminal T5. A second terminal of the P-type transistor 656 is coupled to a second terminal of the P-type transistor 654. A first terminal of the N-type transistor 661 is coupled to the fifth connection terminal T5. A gate terminal of the N-type transistor 661 is coupled to the eighth connection terminal T8. A first terminal of the N-type transistor 662 is coupled to the eighth connection terminal T8. A gate terminal of the N-type transistor 662 is coupled to the fifth connection terminal T5. A second terminal of the N-type transistor 662 is coupled to a second terminal of the N-type transistor 661. A first terminal of the P-type transistor 663 is coupled to the fifth connection terminal T5. A gate terminal of the P-type transistor 663 is coupled to the eighth connection terminal T8. A second terminal of the P-type transistor 663 is coupled to the second terminal of the P-type transistor 654. A first terminal of the P-type transistor 664 is coupled to the eighth connection terminal T8. A gate terminal of the P-type transistor 664 is coupled to the fifth connection terminal T5. A second terminal of the P-type transistor 664 is coupled to a second terminal of the P-type transistor 663. A first terminal of the P-type transistor 665 is coupled to the fifth connection terminal T5. A gate terminal of the P-type transistor 665 is coupled to the first connection terminal T1. A second terminal of the P-type transistor 665 is coupled to the second terminal of the P-type transistor 663. A first terminal of the P-type transistor 666 is coupled to the eighth connection terminal T8. A gate terminal of the P-type transistor 666 is coupled to the fourth connection terminal T4. A second terminal of the P-type transistor 666 is coupled to a second terminal of the P-type transistor 664.

The injection-locked frequency divider 600 further includes buffer circuits 671, 672, 673, and 674. Details of the buffer circuits 671, 672, 673, and 674 can be learnt by referring to teachings of the embodiment of FIG. 3. The buffer circuit 671 is coupled to the first connection terminal T1. The buffer circuit 672 is coupled to the fourth connection terminal T4. The buffer circuit 673 is coupled to the fifth connection terminal T5. The buffer circuit 674 is coupled to the eighth connection terminal T8. It should be noted that a frequency of the injection signal SIN3 is three times of a frequency of the frequency divided signal. When the frequency divided signal outputted from the buffer circuit 671 has a phase of 0°, the buffer circuits 672, 673, and 674 exhibit relative phase differences of 180°, 90°, and 270° respectively relative to the buffer circuit 671. In other words, if a signal output terminal OUT1 outputs an output with a phase of 0°, relative phases of outputs from the signal output terminals OUT1, OUT2, OUT3, and OUT4 are 0°, 180°, 90°, and 270°, respectively. The frequency divided signal having four phases generated hereby can be used in digital modulation for reducing a bit error rate (BER) thereof, or reducing a data transmittance error rate.

The second terminal of the variable capacitor 614A and the second terminal of the variable capacitor 634A receive the reactance control signal VTUNE, and the first oscillator 610 and the second oscillator 620 adjust the injection locking range according to the reactance control signal VTUNE. Further, the first oscillator 610 and the second oscillator 620 can be Colpitts oscillators, Hartley oscillators, or Armstrong oscillators.

In summary, the injection-locked frequency divider according to the present invention receives a differential injection signal with two input terminals. There is a phase difference of 180° between these two input terminals. As such, the injection-locked frequency divider according to the present invention is adapted to substitute conventional direct injection-locked frequency dividers. Generally, the injection-locked frequency divider according to the present invention has at least the following advantages:
1. having a wide injection locking range;
2. achieving a function to dividing frequency by 3;
3. operable with a low operation voltage;
4. operable in a high frequency circuit, and therefore can be conveniently used in different kinds of hybrid ICs; and
5. saving a layer of layout of transistors by the differential signal injection mode, so as to save the power consumption thereof and the heat produced thereby.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An injection-locked frequency divider, adapted for dividing a frequency of an injection signal, and obtaining a frequency divided signal, the injection-locked frequency divider comprising:
   a signal injection unit, comprising a first input terminal and a second input terminal for receiving the injection signal, wherein the received injection signal exhibits a phase difference of 180° between the first input terminal and the second input terminal; and
   an oscillator, comprising:
      an inductor unit, comprising a first connection terminal, a second connection terminal, a third connection terminal, and a fourth connection terminal, wherein the first connection terminal, the second connection terminal, the third connection terminal, and the fourth connection terminal of the inductor unit are coupled to the signal injection unit; and
      a variable capacitance unit, having a first terminal coupled to the first connection terminal, and a second terminal coupled to the fourth connection terminal.

2. The injection-locked frequency divider according to claim 1, wherein the signal injection unit comprises:
   a first transistor having a first terminal coupled to the second connection terminal, a second terminal coupled to the first connection terminal, and a gate terminal coupled to the first input terminal; and
   a second transistor having a first terminal coupled to the third connection terminal, a second terminal coupled to the fourth connection terminal, and a gate terminal coupled to the second input terminal.

3. The injection-locked frequency divider according to claim 1 further comprising a first buffer circuit coupled to the oscillator for outputting the frequency divided signal.

4. The injection-locked frequency divider according to claim 3 further comprising a second buffer circuit coupled to the fourth connection terminal, wherein the first buffer circuit is coupled to the first connection terminal, and the frequency divided signal outputted from the first buffer circuit and a frequency divided signal outputted from the second buffer terminal have a relative phase difference of 180°.

5. The injection-locked frequency divider according to claim 1, wherein the variable capacitance unit comprises:

a first variable capacitor, wherein a first terminal of the first variable capacitor is coupled to the first connection terminal; and a second variable capacitor, wherein a first terminal of the second variable capacitor is coupled to the fourth connection terminal, and a second terminal of the second variable capacitor is coupled to the second terminal of the first variable capacitor.

6. The injection-locked frequency divider according to claim 5, wherein the second terminal of the first variable capacitor receives a reactance control signal, according to which the oscillator adjusts the injection locking range.

7. The injection-locked frequency divider according to claim 1, wherein the oscillator further comprises a negative impedance unit, the negative impedance unit comprising:

a third transistor, wherein a first terminal of the third transistor is coupled to the first connection terminal, and a gate terminal of the third transistor is coupled to the fourth connection terminal; and a fourth transistor, wherein a first terminal of the fourth transistor is coupled to the fourth connection terminal, a gate terminal of the fourth transistor is coupled to the first connection terminal, and a second terminal of the fourth transistor is coupled to a second terminal of the third transistor.

8. The injection-locked frequency divider according to claim 7, wherein the third transistor and the fourth transistor are N-type transistors.

9. The injection-locked frequency divider according to claim 7, wherein the third transistor and the fourth transistor are P-type transistors.

10. The injection-locked frequency divider according to claim 8, wherein the negative impedance unit comprises:

a fifth transistor, wherein a first terminal of the fifth transistor is coupled to the first connection terminal, and a gate terminal of the fifth transistor is coupled to the fourth connection terminal; and a sixth transistor, wherein a first terminal of the sixth transistor is coupled to the fourth connection terminal, a gate terminal of the sixth transistor is coupled to the first connection terminal, and a second terminal of the sixth terminal is coupled to a second terminal of the fifth terminal, wherein the fifth transistor and the sixth transistor are P-type transistors.

11. The injection-locked frequency divider according to claim 1, wherein the oscillator is a Colpitts oscillator.

12. The injection-locked frequency divider according to claim 1, wherein the oscillator is a Hartley oscillator.

13. The injection-locked frequency divider according to claim 1, wherein the oscillator is an Armstrong oscillator.

14. The injection-locked frequency divider according to claim 1, wherein the frequency of the injection signal is three times that of the frequency divided signal.

15. An injection-locked frequency divider, adapted for dividing a frequency of an injection signal, and obtaining a frequency divided signal, the injection-locked frequency divider comprising:

a signal injection unit, comprising a first input terminal, a second input terminal, a third input terminal, and a fourth input terminal for receiving the injection signal, wherein the received injection signal exhibits a phase difference of 0° between the first input terminal and the third input terminal, a phase difference of 180° between the first input terminal and the second input terminal, and a phase difference of 180° between the first input terminal and the fourth input terminal;

a first oscillator, comprising:

a first inductor unit, comprising a first connection terminal, a second connection terminal, a third connection terminal, and a fourth connection terminal, wherein the first connection terminal, the second connection terminal, the third connection terminal, and the fourth connection terminal of the first inductor unit are coupled to the signal injection unit; and a first variable capacitance unit, having a first terminal coupled to the first connection terminal, and a second terminal coupled to the fourth connection terminal; and a second oscillator, comprising:

a second inductor unit, comprising a fifth connection terminal, a sixth connection terminal, a seventh connection terminal, and an eighth connection terminal, wherein the fifth connection terminal, the sixth connection terminal, the seventh connection terminal, and the eighth connection terminal of the second inductor unit are coupled to the signal injection unit; and a second variable capacitance unit, having a first terminal coupled to the fifth connection terminal, and a second terminal coupled to the eighth connection terminal.

16. The injection-locked frequency divider according to claim 15, wherein the signal injection unit comprises:

a first transistor, having a first terminal coupled to the second connection terminal, a second terminal coupled to the first connection terminal, and a gate terminal coupled to the first input terminal;

a second transistor, having a first terminal coupled to the third connection terminal, a second terminal coupled to the fourth connection terminal, and a gate terminal coupled to the second input terminal;

a third transistor, having a first terminal coupled to the sixth connection terminal, a second terminal coupled to the fifth connection terminal, and a gate terminal coupled to the third input terminal; and a fourth transistor, having a first terminal coupled to the seventh connection terminal, a second terminal coupled to the eighth connection terminal, and a gate terminal coupled to the fourth input terminal.

17. The injection-locked frequency divider according to claim 15, wherein the first variable capacitance unit comprises a first variable capacitor and a second variable capacitor, and the second variable capacitance unit comprises a third variable capacitor and a fourth variable capacitor, wherein a first terminal of the first variable capacitor is coupled to the first connection terminal;

a first terminal of the second variable capacitor is coupled to the fourth connection terminal;

a second terminal of the second variable capacitor is coupled to a second terminal of the first variable capacitor;

a first terminal of the third variable capacitor is coupled to the fifth connection terminal;

a first terminal of the fourth variable capacitor is coupled to the eighth connection terminal; and a second terminal of the third variable capacitor is coupled to a second terminal of the fourth variable capacitor.

18. The injection-locked frequency divider according to claim 15, wherein the first oscillator further comprises a first negative impedance unit, and the second oscillator further comprises a second negative impedance unit, wherein the first negative impedance unit comprises:

a fifth N-type transistor, wherein a first terminal of the fifth N-type transistor is coupled to the first connection terminal, and a gate terminal of the fifth N-type transistor is coupled to the fourth connection terminal;

a sixth N-type transistor, wherein a first terminal of the sixth N-type transistor is coupled to the fourth connection terminal, a gate terminal of the sixth N-type transistor is coupled to the first connection terminal, and a second terminal of the sixth N-type transistor is coupled to a second terminal of the fifth N-type transistor;

a seventh P-type transistor, wherein a first terminal of the seventh P-type transistor is coupled to the first connection terminal, and a gate terminal of the seventh P-type transistor is coupled to the fourth connection terminal;

an eighth P-type transistor, wherein a first terminal of the eighth P-type transistor is coupled to the fourth connection terminal, a gate terminal of the eighth P-type transistor is coupled to the first connection terminal, and a second terminal of the eighth P-type transistor is coupled to a second terminal of the seventh P-type transistor;

a ninth P-type transistor, wherein a first terminal of the ninth P-type transistor is coupled to the first connection terminal, a gate terminal of the ninth P-type transistor is coupled to the eighth connection terminal, and a second terminal of the ninth P-type transistor is coupled to the second terminal of the seventh P-type transistor; and a tenth P-type transistor, wherein a first terminal of the tenth P-type transistor is coupled to the fourth connection terminal, a gate terminal of the tenth P-type transistor is coupled to the fifth connection terminal, and a second terminal of the tenth P-type transistor is coupled to a second terminal of the eighth P-type transistor; and the second negative impedance unit comprises:

an eleventh N-type transistor, wherein a first terminal of the eleventh N-type transistor is coupled to the fifth connection terminal, and a gate terminal of the eleventh N-type transistor is coupled to the eighth connection terminal;

a twelfth N-type transistor, wherein a first terminal of the twelfth N-type transistor is coupled to the eighth connection terminal, a gate terminal of the twelfth N-type transistor is coupled to the fifth connection terminal, and a second terminal of the twelfth N-type transistor is coupled to a second terminal of the eleventh N-type transistor;

a thirteenth P-type transistor, wherein a first terminal of the thirteenth P-type transistor is coupled to the fifth connection terminal, a gate terminal of the thirteenth P-type transistor is coupled to the eighth connection terminal, and a second terminal of the thirteenth P-type transistor is coupled to the second terminal of the eighth P-type transistor;

a fourteenth P-type transistor, wherein a first terminal of the fourteenth P-type transistor is coupled to the eighth connection terminal, a gate terminal of the fourteenth P-type transistor is coupled to the fifth connection terminal, and a second terminal of the fourteenth P-type transistor is coupled to a second terminal of the thirteenth P-type transistor;

a fifteenth P-type transistor, wherein a first terminal of the fifteenth P-type transistor is coupled to the fifth connection terminal, a gate terminal of the fifteenth P-type transistor is coupled to the first connection terminal, and a second terminal of the fifteenth P-type transistor is coupled to the second terminal of the thirteenth P-type transistor; and a sixteenth P-type transistor, wherein a first terminal of the sixteenth P-type transistor is coupled to the eighth connection terminal, a gate terminal of the sixteenth P-type transistor is coupled to the fourth connection terminal, and a second terminal of the sixteenth P-type transistor is coupled to a second terminal of the fourteenth P-type transistor.

19. The injection-locked frequency divider according to claim 18 further comprising a first buffer circuit, a second buffer circuit, a third buffer circuit, and a fourth buffer circuit, wherein the first buffer circuit is coupled to the first connection terminal; the second buffer circuit is coupled to the fourth connection terminal; the third buffer circuit is coupled to the fifth connection terminal; and the fourth buffer circuit is coupled to the eighth connection terminal, wherein when the frequency divided signal outputted from the first buffer circuit has a phase of 0°, the second buffer circuit, the third buffer circuit, and the fourth buffer circuit exhibit relative phase differences of 180°, 90°, and 270° respectively relative to the first buffer circuit.

20. The injection-locked frequency divider according to claim 15, wherein the first variable capacitance unit comprises:

a first variable capacitor, having a first terminal coupled to the first connection terminal;

a second variable capacitor, having a first terminal coupled to the fourth connection terminal, and a second terminal coupled to a second terminal of the first variable capacitor; and wherein the second variable capacitance unit comprises:

a third variable capacitor, having a first terminal coupled to the fifth connection terminal; and a fourth variable capacitor, having a first terminal coupled to the eighth connection terminal, and a second terminal coupled to a second terminal of the third variable capacitor.

21. The injection-locked frequency divider according to claim 20, wherein the second terminal of the first variable capacitor and the second terminal of the third variable capacitor receive a reactance control signal, and the first oscillator and the second oscillator adjust the injection locking range according to the reactance control signal.

22. The injection-locked frequency divider according to claim 15, wherein the first oscillator and the second oscillator are Colpitts oscillators.

23. The injection-locked frequency divider according to claim 15, wherein the first oscillator and the second oscillator are Hartley oscillators.

24. The injection-locked frequency divider according to claim 15, wherein the first oscillator and the second oscillator are Armstrong oscillators.

25. The injection-locked frequency divider according to claim 15, wherein a frequency of the injection signal of the injection-locked frequency divider is three times that of the frequency divided signal.

* * * * *